(12) United States Patent
Luo

(10) Patent No.: US 12,550,430 B2
(45) Date of Patent: Feb. 10, 2026

(54) ARRAY SUBSTRATE, METHOD FOR FABRICATING SAME, AND DISPLAY PANEL

(71) Applicant: TCL CHINA STAR OPTOELECTRONICS TECHNOLOGY CO., LTD., Shenzhen (CN)

(72) Inventor: Chuanbao Luo, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 518 days.

(21) Appl. No.: 18/081,125

(22) Filed: Dec. 14, 2022

(65) Prior Publication Data
US 2024/0063233 A1  Feb. 22, 2024

(30) Foreign Application Priority Data
Aug. 16, 2022 (CN) .......................... 202210980926.6

(51) Int. Cl.
| | | |
|---|---|---|
| H01L 27/12 | (2006.01) |
| H10D 86/01 | (2025.01) |
| H10D 86/40 | (2025.01) |
| H10D 86/60 | (2025.01) |

(52) U.S. Cl.
CPC ....... H10D 86/0231 (2025.01); H10D 86/471 (2025.01); H10D 86/60 (2025.01)

(58) Field of Classification Search
CPC ............. H10D 86/471; H10D 86/0231; H10D 86/423; H10D 86/60; H10D 30/6713; H10D 30/6755; H10D 30/6734; H10D 30/6723; H10D 86/01; H10D 86/40; H10D 86/421; H10D 30/67
See application file for complete search history.

(56) References Cited

U.S. PATENT DOCUMENTS

| | | | |
|---|---|---|---|
| 10,741,625 B2 * | 8/2020 | Kang | ................... G09G 3/3233 |
| 2019/0204668 A1 | 7/2019 | Yang | |
| 2019/0288048 A1 * | 9/2019 | Kang | ................. H10K 59/1213 |

FOREIGN PATENT DOCUMENTS

| | | |
|---|---|---|
| CN | 101542735 A | 9/2009 |
| CN | 101958339 A | 1/2011 |
| CN | 113270424 A | 8/2021 |

OTHER PUBLICATIONS

Chinese Office Action issued in corresponding Chinese Patent Application No. 202210980926.6 dated Apr. 30, 2025, pp. 1-8.

* cited by examiner

*Primary Examiner* — Nikolay K Yushin
(74) *Attorney, Agent, or Firm* — PV IP PC; Christopher S. Ruprecht; Wei Te Chung

(57) ABSTRACT

An array substrate includes at least one low temperature polysilicon thin film transistor and at least one oxide thin film transistor. The low temperature polysilicon thin film transistor includes an active layer and a first gate electrode. The oxide thin film transistor includes an oxide semiconductor layer, a second source electrode, and a second drain electrode. The first gate electrode, the second source electrode, and the second drain electrode are disposed in a same layer, and the active layer and the oxide semiconductor layer are disposed in different layers. A method is used for fabricating the array substrate. A display panel includes the array substrate.

12 Claims, 5 Drawing Sheets

ARRAY SUBSTRATE, METHOD FOR FABRICATING SAME, AND DISPLAY PANEL

CROSS-REFERENCE TO RELATED APPLICATIONS

This application claims the benefit of Chinese Patent Application No. 202210980926.6, filed on Aug. 16, 2022. The entire disclosure of the above application is incorporated herein by reference.

FIELD

The present disclosure relates to the technical field of display, and particularly to an array substrate, a method for fabricating the same, and a display panel.

INTRODUCTION

This section provides background information related to the present disclosure which is not necessarily prior art.

A driving substrate of a self-luminous display device such as an active driving OLED, a Micro LED, or a Mini LED generally requires two or more thin film transistors to control a display state of a single pixel, for example, a common 2T1C circuit or a common 3T1C circuit. On the other hand, with the rapid development of 5G and internet of things (IoT), application scenarios of mobile terminals are more diverse. For a display panel, when a high display refresh frequency is not required, reducing a display refresh frequency can effectively reduce a display power consumption. Currently, mainstream high-resolution self-luminous displays mainly use low-temperature polysilicon thin film transistors, which are mainly characterized by high mobility and high leakage current. The high leakage current makes driving power consumption higher. In a pixel circuit, if a transistor that controls a capacitance is replaced with a low-current transistor, and a transistor that drives a pixel to emit light remains a high-mobility transistor, a refresh frequency of the pixel can be reduced without flickering. Reducing the refresh frequency can effectively reduce the driving power consumption.

A current pixel structure comprising low temperature polysilicon thin film transistors and oxide thin film transistors requires more photomasks and complex processes. In some existing technologies, in order to save photomasks, these two types of thin film transistors are fabricated in a same manufacturing process, and low temperature polysilicon active layers and oxide semiconductor layers are disposed on a same layer. In this way, a high temperature of a laser annealing process in the manufacturing process affects electrical characteristics of one type of the thin film transistors. Specifically, the oxide semiconductor layers in the oxide thin film transistors are sensitive to an external environment. Under influence of temperature, light, and other factors, additional carriers will be induced inside the oxide semiconductor layers and migrate under an electric field. At this point, performance of the oxide thin film transistors will change, and the most important offset parameter is a threshold voltage.

Therefore, it is necessary to provide a solution to solve the above problem.

SUMMARY

The present disclosure provides an array substrate, a method for fabricating the same, and a display panel, which can solve a technical problem that a manufacturing process of an array substrate comprising low temperature polysilicon thin film transistors and oxide thin film transistors is complicated in the prior art.

In order to solve the above problem, the present disclosure provides the following technical solutions.

The present disclosure provides an array substrate comprising at least one low temperature polysilicon thin film transistor and at least one oxide thin film transistor. The at least one low temperature polysilicon thin film transistor comprises an active layer and a first gate electrode. The at least one oxide thin film transistor comprises an oxide semiconductor layer, a second source electrode, and a second drain electrode. The first gate electrode, the second source electrode, and the second drain electrode are disposed in a same layer, and the active layer and the oxide semiconductor layer are disposed in different layers.

Optionally, in some embodiments, the array substrate further comprises a substrate. The low temperature polysilicon thin film transistor and the oxide thin film transistor are disposed on the substrate. The first gate electrode is located on a side of the active layer away from the substrate. The second source electrode and the second drain electrode are located on a side of the oxide semiconductor layer close to the substrate.

Optionally, in some embodiments, the low temperature polysilicon thin film transistor further comprises a first source electrode and a first drain electrode located on a side of the active layer close to the substrate. The active layer is electrically connected to the first source electrode through a first via hole, and the active layer is electrically connected to the first drain electrode through a second via hole. The oxide thin film transistor further comprises a second gate electrode located on a side of the oxide semiconductor layer away from the substrate. The oxide semiconductor layer is electrically connected to the second source electrode through a third via hole, and the oxide semiconductor layer is electrically connected to the second drain electrode through a fourth via hole.

Optionally, in some embodiments, an orthographic projection of the second source electrode on the substrate overlaps with an orthographic projection of the first drain electrode on the substrate, and the orthographic projection of the second source electrode on the substrate is spaced apart from an orthographic projection of the first gate electrode on the substrate.

Optionally, in some embodiments, the second source electrode is located between the first gate electrode and the second drain electrode. An orthographic projection of the oxide semiconductor layer on the substrate overlaps with an orthographic projection of the active layer on the substrate, and the orthographic projection of the oxide semiconductor layer on the substrate is spaced apart from an orthographic projection of the first source electrode on the substrate.

Optionally, in some embodiments, the oxide semiconductor layer comprises a channel region corresponding to the second gate electrode and two conductor regions located on two opposite sides of the channel region. An orthographic projection of one conductor region on the substrate covers the orthographic projection of the first gate electrode on the substrate, and a capacitor is formed between the conductor region and the first gate electrode.

The present disclosure further provides a display panel comprising the aforementioned array substrate.

The present disclosure further provides a method for fabricating an array substrate, which comprises: providing a base substrate, and forming at least one low temperature polysilicon thin film transistor and at least one oxide thin film transistor on the substrate. The low temperature polysilicon thin film transistor comprises an active layer and a first gate electrode. The oxide thin film transistor comprises an oxide semiconductor layer, a second source electrode, and a second drain electrode. The active layer and the oxide semiconductor layer are disposed in different layers. The first gate electrode, the second source electrode, and the second drain electrode are formed by using a same mask.

Optionally, in some embodiments, the forming the at least one low temperature polysilicon thin film transistor and the at least one oxide thin film transistor on the substrate comprises: sequentially forming a first metal layer and a first insulating layer on the substrate, wherein the first metal layer comprises a first source electrode and a first drain electrode spaced apart from each other, and the first insulating layer is provided with a first via hole exposing the first source electrode and a second via hole exposing the first drain electrode; sequentially forming an active layer, a second insulating layer, and a second metal layer on the first insulating layer, wherein the active layer comprises a first channel region and two first conductor regions located on two opposite sides of the first channel region, one first conductor region is electrically connected to the first source electrode through the first via hole, the other first conductor region is electrically connected to the first drain electrode through the second via hole, the second metal layer comprises a first gate electrode, a second source electrode, and a second drain electrode spaced apart from each other, and the first gate electrode corresponds to the first channel region; and sequentially forming a third insulating layer, an oxide semiconductor layer, a fourth insulating layer, and a second gate electrode on the second metal layer, wherein the third insulating layer is provided with a third via hole exposing the second source electrode and a fourth via hole exposing the second drain electrode, the oxide semiconductor layer comprises a second channel region and two second conductor regions located on two opposite sides of the second channel region, one second conductor region is electrically connected to the second source electrode through the third via hole, the other second conductor region is electrically connected to the second drain electrode through the fourth via hole, and the second gate electrode corresponds to the second channel region. The first source electrode, the first drain electrode, the active layer, and the first gate electrode constitute a low temperature polysilicon thin film transistor. The second source electrode, the second drain electrode, the oxide semiconductor layer, and the second gate electrode constitute an oxide thin film transistor.

Optionally, in some embodiments, an orthographic projection of the second source electrode on the substrate overlaps with an orthographic projection of the first drain electrode on the substrate. After the active layer is formed on the first insulating layer and before the second insulating layer and the second metal layer are formed, the method further comprises: ion doping regions of the active layer to be conductorized to form the first conductor regions.

In the array substrate, the method for fabricating the same, and the display panel provided by the present disclosure, the gate electrode of the low temperature polysilicon thin film transistor and the source electrode and the drain electrode of the oxide thin film transistor are made with a same photomask, so that some layers are shared, and a manufacturing process is simplified.

Further areas of applicability will become apparent from the description provided herein. The description and specific examples in this summary are intended for purposes of illustration only and are not intended to limit the scope of the present disclosure.

DRAWINGS

In order to more clearly illustrate technical solutions in embodiments of the present disclosure, a brief description of accompanying drawings used in a description of the embodiments will be given below. Obviously, the accompanying drawings in the following description are merely some embodiments of the present disclosure. For those skilled in the art, other drawings may be obtained from these accompanying drawings without creative labor.

DETAILED DESCRIPTION

Technical solutions in embodiments of the present disclosure will be clearly and completely described below in conjunction with accompanying drawings in the embodiments of the present disclosure. It is apparent that the described embodiments are merely a part of the embodiments of the present disclosure and not all embodiments. All other embodiments obtained by those skilled in the art based on the embodiments of the present disclosure without creative labor are within claimed scope of the present disclosure. In addition, it should be understood that specific embodiments described herein are only used to illustrate and explain the present invention, and are not used to limit the present invention. In the present disclosure, unless otherwise stated, directional terms used herein specifically indicate directions of the accompanying drawings. For example, directional terms "upper" and "lower" generally refer to upper and lower positions of a device in actual use or working conditions, and directional terms "inside" and "outside" refer to positions relative to a profile of the device.

Figure 1:
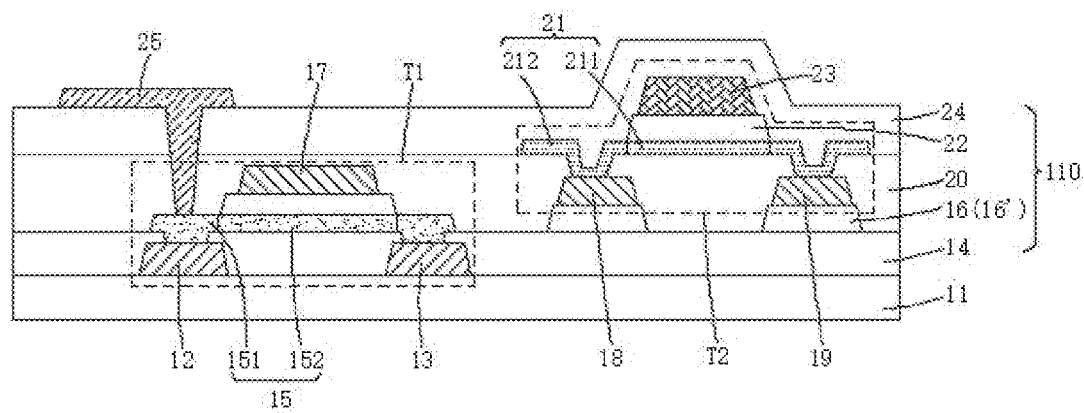
FIG. 1 is a schematic structural diagram of an array substrate according to a first embodiment of the present disclosure.
Figure 2:
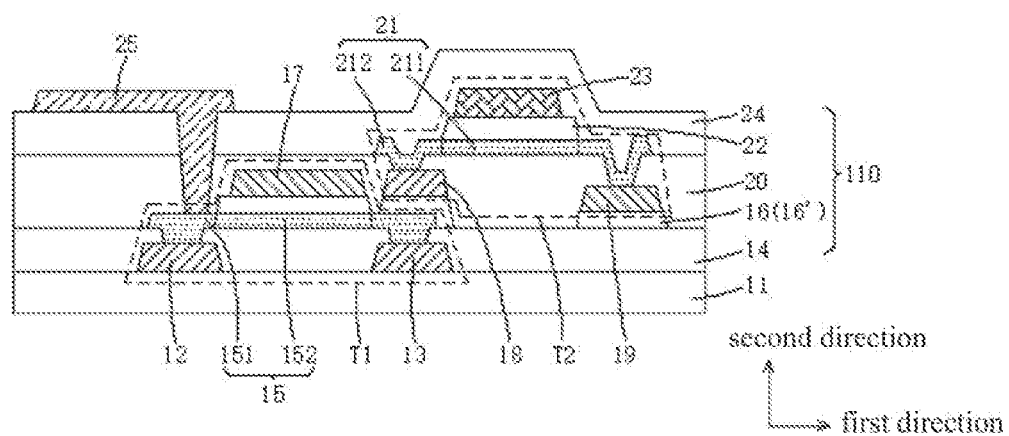
FIG. 2 is a schematic structural diagram of an array substrate according to a second embodiment of the present disclosure.
Figure 3:
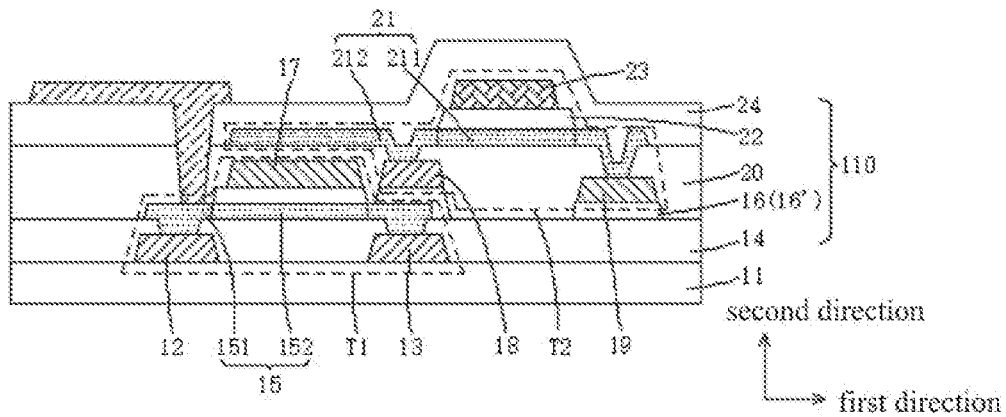
FIG. 3 is a schematic structural diagram of an array substrate according to a third embodiment of the present disclosure.
Figure 4:
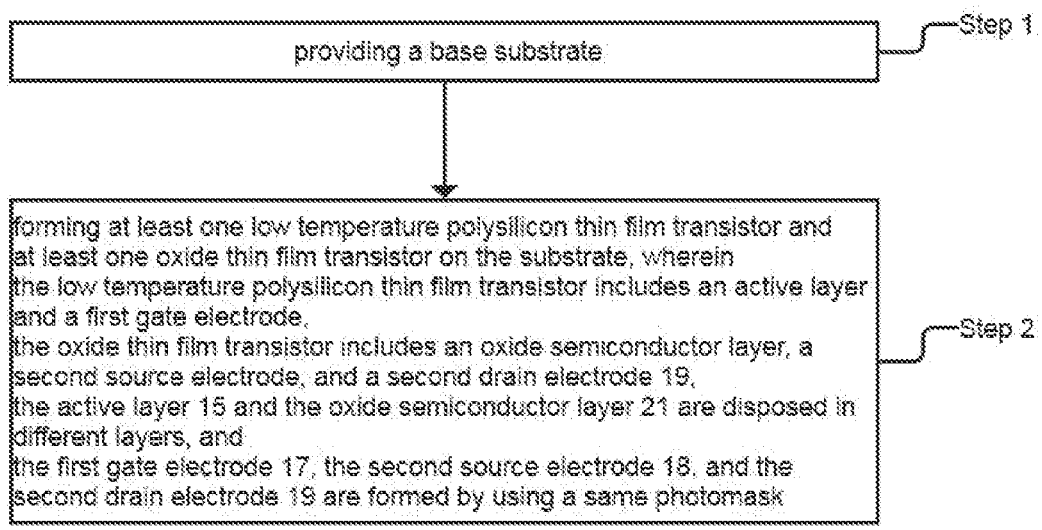
FIG. 4 is a flowchart of a method for fabricating the array substrate according to the first embodiment of the present disclosure.

Please refer to FIG. 1 to FIG. 3, the present disclosure provides an array substrate, which includes at least one low temperature polysilicon thin film transistor T1 and at least one oxide thin film transistor T2. The low temperature polysilicon thin film transistor T1 includes an active layer 15 and a first gate electrode 17. The oxide thin film transistor T2 includes an oxide semiconductor layer 21, a second source electrode 18, and a second drain electrode 19. The first gate electrode 17 is disposed in a same layer as the second source electrode 18 and the second drain electrode 19. The active layer 15 and the oxide semiconductor layer 21 are disposed in different layers.

In the embodiments of the present disclosure, the first gate electrode 17 of the low temperature polysilicon thin film transistor T1 and the second source electrode 18 and the second drain electrode 19 of the oxide thin film transistor T2 are disposed in the same layer, so that the first gate electrode 17 of the low temperature polysilicon thin film transistor T1 and the second source electrode 18 and the second drain electrode 19 of the oxide thin film transistor T2 can be simultaneously formed with only one photomask. Compared with a conventional structure in which a low temperature polysilicon thin film transistor and an oxide thin film transistor are separately fabricated, the embodiments of the present disclosure can save at least one photomask and simplify a manufacturing process.

The array substrate of the present disclosure will be described in detail below with reference to specific embodiments.

Please refer to FIG. 1, which is a schematic structural diagram of an array substrate according to a first embodiment of the present disclosure. The array substrate includes a base substrate 11 and at least one low temperature polysilicon thin film transistor T1 and at least one oxide thin film transistor T2 disposed on the base substrate 11. The base substrate 11 may be a rigid substrate or a flexible substrate, which is not limited herein. The array substrate further includes an inorganic stacked layer 110 disposed on the base substrate 11. The at least one low temperature polysilicon thin film transistor T1 and the at least one oxide thin film transistor T2 are located in the inorganic stacked layer 110.

The inorganic stacked layer 110 includes a first insulating layer 14, a second insulating layer 16, a third insulating layer 20, a fourth insulating layer 22, and a fifth insulating layer 24 stacked from bottom to top, but not limited thereto.

In an embodiment, the first insulating layer 14 may be a buffer layer, the second insulating layer 16 may be a first gate insulating layer, and the third insulating layer 20 may be an interlayer dielectric layer, the fourth insulating layer 22 may be a second gate insulating layer, and the fifth insulating layer 24 may be a passivation layer.

Both the low temperature polysilicon thin film transistor T1 and the oxide thin film transistor T2 in this embodiment have top gate structures. The low temperature polysilicon thin film transistor T1 further includes a first source electrode 12 and a first drain electrode 13 disposed on a side of the active layer 15 close to the base substrate 11. The oxide thin film transistor T2 further includes a second gate electrode 23 disposed on a side of the oxide semiconductor layer 21 away from the base substrate 11.

Specifically, the first source electrode 12 and the first drain electrode 13 are disposed on the base substrate 11 at intervals. The first insulating layer 14 is disposed on the first source electrode 12, the first drain electrode 13, and the base substrate 11. The active layer 15 is disposed on the first insulating layer 14. The active layer 15 is electrically connected to the first source electrode 12 through a first via hole penetrating the first insulating layer 14. The active layer 15 is electrically connected to the first drain electrode 13 through a second via hole penetrating the first insulating layer 14. The active layer 15 includes a first channel region 152 and two first conductor regions 151 located on two opposite sides of the first channel region 152. The second insulating layer 16 is disposed on the active layer 15 and the first insulating layer 14. The first gate electrode 17, the second source electrode 18, and the second drain electrode 19 are disposed in the same layer on the second insulating layer 16 and spaced apart from each other. The second insulating layer 16 includes insulating layer patterns corresponding to the first gate electrode 17, the second source electrode 18, and the second drain electrode 19, respectively. The first gate electrode 17, the second source electrode 18, and the second drain electrode 19 respectively form a stack structure with the corresponding insulating layer pattern. An entire layer of the third insulating layer 20 is disposed on the first gate electrode 17, the second source electrode 18, and the second drain electrode 19. The oxide semiconductor layer 21 is disposed on the third insulating layer 20. The oxide semiconductor layer 21 is electrically connected to the second source electrode 18 through a third via hole penetrating the third insulating layer 20. The oxide semiconductor layer 21 is electrically connected to the second drain electrode 19 through a fourth via hole penetrating the third insulating layer 20. The oxide semiconductor layer 21 includes a second channel region 211 and two second conductor regions 212 located on two opposite sides of the second channel region 211. The fourth insulating layer 22 and the second gate electrode 23 are sequentially disposed on the oxide semiconductor layer 21 corresponding to the second channel region 211. An entire layer of the fifth insulating layer 24 is disposed on the second gate electrode 23.

In this embodiment, the oxide semiconductor layer 21 is located on a layer above the active layer 15. On the one hand, this can prevent doping ions from entering into the oxide semiconductor layer 21 when the active layer 15 is doped with the doping ions, and thus prevent degradation of electrical stability of the oxide thin film transistor T2. On the other hand, this can avoid an influence on crystalline properties of the oxide semiconductor layer 21 when amorphous silicon of the active layer 15 is converted into polysilicon through a laser annealing process. Therefore, this embodiment can simplify a manufacturing process and maintain the electrical stability of the oxide thin film transistor T2. In addition, in the oxide thin film transistor T2, a bottom surface of the oxide semiconductor layer 21 is in contact with a top surface of the second source electrode 18 and a top surface of the second drain electrode 19, which saves a process of forming an interlayer dielectric layer (ILD) on an oxide semiconductor layer in a conventional structure. The interlayer dielectric layer is generally formed by a CVD process, and a high temperature of the CVD process will affect crystalline properties of the oxide semiconductor layer. The thin film transistors of the present disclosure adopt this structural design, which can further improve electrical stability of the thin film transistors. Furthermore, in this embodiment, the oxide semiconductor layer 21 is located above the third insulating layer 20 (i.e. the interlayer dielectric layer), so a high temperature of a CVD process of the third insulating layer 20 will not affect the electrical stability of the oxide thin film transistor T2.

It can be understood that in other embodiments, other conventional layers, such as a light shielding layer, may also be disposed between the base substrate 11 and the first source electrode 12, and between the base substrate 11 and the first drain electrode 13, which are not limited herein.

Furthermore, the array substrate further includes a pixel electrode 25. The pixel electrode 25 is disposed on the fifth insulating layer 24. The pixel electrode 25 is electrically connected to the first source electrode 12 of the low temperature polysilicon thin film transistor T1 through a fifth via hole penetrating the fifth insulating layer 24 and the third insulating layer 20. The low-temperature polysilicon thin film transistor T1 may be used as a driving thin film transistor, and has high mobility, thereby reducing a driving voltage and achieving high refresh frequency and high resolution. The oxide thin film transistor T2 can be used as a switching thin film transistor, and has a low leakage current, so that a display panel can maintain a good display effect at a low frame rate, thereby reducing power consumption of the display panel.

Please refer to FIG. 2, which is a schematic structural diagram of an array substrate according to a second embodiment of the present disclosure. The array substrate includes a base substrate 11 and at least one low temperature polysilicon thin film transistor T1 and at least one oxide thin film transistor T2 disposed on the base substrate 11. The array substrate further includes an inorganic stacked layer 110 disposed on the base substrate 11. The at least one low temperature polysilicon thin film transistor T1 and the at least one oxide thin film transistor T2 are located in the inorganic stacked layer 110. Structures and compositions of the low temperature polysilicon thin film transistor T1, the oxide thin film transistor T2, and the inorganic stacked layer 110 are same as those in the first embodiment. For details, please refer to a description of the first embodiment, which is not repeated herein. This embodiment differs from the first embodiment in that the low temperature polysilicon thin film transistor T1 and the oxide thin film transistor T2 in the array substrate of this embodiment partially overlap in a direction perpendicular to the array substrate, thereby reducing a space occupied by the thin film transistors and increasing a pixel aperture ratio.

Specifically, an orthographic projection of the second source electrode 18 of the oxide thin film transistor T2 on the base substrate 11 overlaps with an orthographic projection of the first drain electrode 13 of the low temperature polysilicon thin film transistor T1 on the base substrate 11.

Furthermore, the orthographic projection of the second source electrode 18 on the base substrate 11 is spaced apart from an orthographic projection of the first gate electrode 17 on the base substrate 11. In addition, the second source electrode 18 is separated from the active layer 15 of the low temperature polysilicon thin film transistor T1 by the second insulating layer 16. Therefore, this design will not affect performance of the low temperature polysilicon thin film transistor T1 and the oxide thin film transistor T2.

Moreover, in an embodiment, an orthographic projection of the oxide semiconductor layer 21 of the oxide thin film transistor T2 on the base substrate 11 overlaps with an orthographic projection of the active layer 15 on the base substrate 11, and is spaced apart from the orthographic projection of the first gate electrode 17 on the base substrate 11.

The orthographic projection of the second source electrode 18 on the base substrate 11 partially overlaps or completely overlaps the orthographic projection of the first drain electrode 13 on the base substrate 11. A direction parallel to the array substrate is a first direction, and the direction perpendicular to the array substrate is a second direction. Because the low temperature polysilicon thin film transistor T1 and the oxide thin film transistor T2 overlap in the second direction, a space occupied by the low temperature polysilicon thin film transistor T1 and the oxide thin film transistor T2 in the first direction is reduced, which provides more space for a pixel aperture, thereby increasing the pixel aperture ratio. Therefore, in addition to simplifying the manufacturing process and improving the electrical stability of the thin film transistors, this embodiment can also increase the pixel aperture ratio.

Please refer to FIG. 3, which is a schematic structural diagram of an array substrate according to a third embodiment of the present disclosure. The array substrate of this embodiment includes a base substrate 11 and an inorganic stacked layer 110 disposed on the base substrate 11, and further includes at least one low temperature polysilicon thin film transistor T1 and at least one oxide thin film transistor T2 disposed in the inorganic stacked layer 110. Structures and compositions of the low temperature polysilicon thin film transistor T1, the oxide thin film transistor T2, and the inorganic stacked layer 110 are same as those in the first embodiment and the second embodiment. For details, please refer to a description of the first embodiment and the second embodiment, which is not repeated herein.

This embodiment differs from the second embodiment in that in this embodiment, an orthographic projection of the oxide semiconductor layer 21 of the oxide thin film transistor T2 on the base substrate 11 overlaps with an orthographic projection of the first gate electrode 17 of the low temperature polysilicon thin film transistor T1 on the base substrate 11, and the orthographic projection of the oxide semiconductor layer 21 on the base substrate 11 is spaced apart from an orthographic projection of the first source electrode 12 of the low temperature polysilicon thin film transistor T1 on the base substrate 11.

The orthographic projection of the first gate electrode 17 on the base substrate 11 falls within the orthographic projection of the oxide semiconductor layer 21 on the base substrate 11. Specifically, the oxide semiconductor layer 21 includes a second channel region 211 corresponding to the second gate electrode 23, and two second conductor regions 212 located on two opposite sides of the second channel region 211. An orthographic projection of one second conductor region 212 on the base substrate 11 covers the orthographic projection of the first gate electrode 17 on the base substrate 11, and the second conductor region 212 and the first gate electrode 17 form a capacitor.

The array substrate of this embodiment has advantages of the array substrates in the first and second embodiments. Because one second conductor region 212 of the oxide semiconductor layer 21 is extended to form a capacitor with the first gate electrode 17 in this embodiment, this embodiment can further reduce a separate process of manufacturing a capacitor. Furthermore, the capacitor formed by the second conductor region 212 and the first gate electrode 17 does not need to occupy additional space, which is beneficial to increase the pixel aperture ratio.

The present disclosure further provides a display panel. The display panel includes the aforementioned array substrate. The display panel may be an LCD display panel, an OLED display panel, a Mini LED display panel, or a Micro LED display panel, but is not limited thereto.

The present disclosure further provides a method for fabricating an array substrate, please refer to FIGS. 4 and 5A-5I, which includes the following steps.

Step 1: providing a base substrate 11.

The base substrate 11 may be a glass substrate or a flexible substrate.

Step 2: forming at least one low temperature polysilicon thin film transistor T1 and at least one oxide thin film transistor T2 on the substrate 11. The low temperature polysilicon thin film transistor T1 includes an active layer 15 and a first gate electrode 17. The oxide thin film transistor T2 includes an oxide semiconductor layer 21, a second source electrode 18, and a second drain electrode 19. The active layer 15 and the oxide semiconductor layer 21 are disposed in different layers. The first gate electrode 17, the second source electrode 18, and the second drain electrode 19 are formed by using a same photomask.

The Step 2 of forming the at least one low temperature polysilicon thin film transistor T1 and the at least one oxide thin film transistor T2 on the substrate 11 comprises the following steps.

Figure 5A:
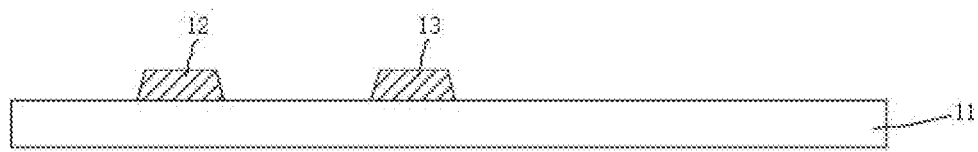
FIG. 5A to FIG. 5I are schematic diagrams of a process of fabricating the array substrate according to the first embodiment of the present disclosure.
Figure 5B:
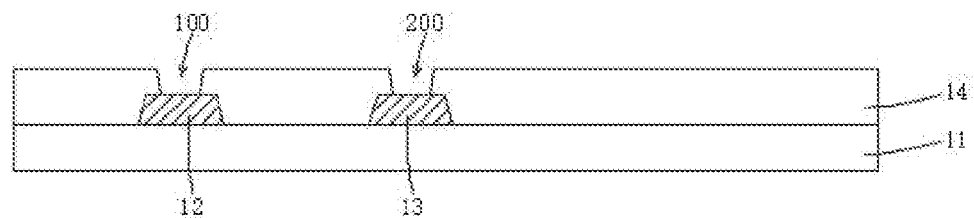

Step S1: as shown in FIGS. 5A and 5B, sequentially forming a first metal layer (12 and 13) and a first insulating layer 14 on the base substrate 11. The first metal layer (12 and 13) includes a first source electrode 12 and a first drain electrode 13 spaced apart from each other. the first insulating layer 14 is provided with a first via hole 100 exposing the first source electrode 12 and a second via hole 200 exposing the first drain electrode 13.

Specifically, a first metal film is formed on the substrate 11 and patterned into the first source electrode 12 and the first drain electrode 13 through a first photomask process. Furthermore, an entire layer of the first insulating layer 14 is formed on the first source electrode 12 and the first drain electrode 13. The first via hole 100 and the second via hole 200 penetrating the first insulating layer 14 are formed in the first insulating layer 14 by a second photomask process.

The first metal layer (12 and 13) may be a single layer of Mo, Al, Ti, or the like, and may also be a laminated structure of Mo/Al, Mo/Cu, MoTi/Cu, MoTi/Cu/MoTi, Ti/Al/Ti, Ti/Cu/Ti, Mo/Cu/IZO, IZO/Cu/IZO, Mo/Cu/ITO, or the like. The first metal layer (12 and 13) may be formed by physical vapor deposition, and the first source electrode 12 and the first drain electrode 13 are formed through an etching process.

Figure 5C:
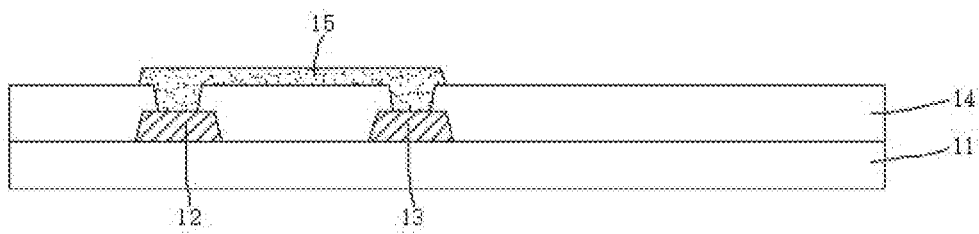
Figure 5D:
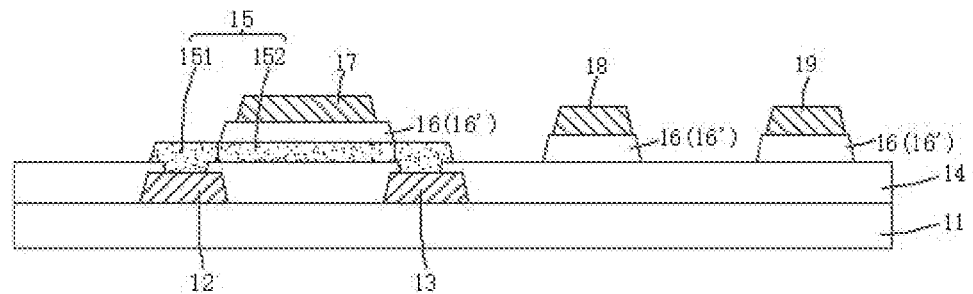

Step S2: as shown in FIGS. 5C and 5D, sequentially forming an active layer 15, a second insulating layer 16, and a second metal layer (17, 18, and 19) on the first insulating layer 14. The active layer 15 includes a first channel region 152 and two first conductor regions 151 located on two opposite sides of the first channel region 152. One first conductor region 151 is electrically connected to the first source electrode 12 through the first via hole 100, and the other first conductor region 151 is electrically connected to the first drain electrode 13 through the second via hole 200. The second metal layer (17, 18, and 19) includes a first gate electrode 17, a second source electrode 18, and a second drain electrode 19 spaced apart from each other. The first gate electrode 17 corresponds to the first channel region 152.

Specifically, an amorphous silicon film is formed on the first insulating layer 14, patterned into an amorphous silicon pattern through a third photomask process, and crystallized into an active layer 15 made of polysilicon through laser annealing. After the active layer 15 is formed, a second insulating film and a second metal film are sequentially deposited on the active layer 15. The second insulating film and the second metal film are patterned into the second metal layer (17, 18, and 19) and a second insulating pattern 16' stacked on each other through a fourth photomask process. Then, using the first gate electrode 17 and a part of the second insulating pattern 16' corresponding to the first gate electrode 17 as a photomask, parts of the active layer 15 not covered by the second insulating pattern 16' are doped to form the first conductor regions 151. Specifically, the parts of the active layer 15 may be doped with phosphorus ions to form N-type heavy doping regions or N-type light doping regions, or may be doped with boron ions to form P-type heavy doping regions, so as to fabricate NMOS or PMOS transistors.

The second metal layer (17, 18, and 19) may also be a single layer of Mo, Al, Ti, or the like, and may also be a laminated structure of Mo/Al, Mo/Cu, MoTi/Cu, MoTi/Cu/MoTi, Ti/Al/Ti, Ti/Cu/Ti, Mo/Cu/IZO, IZO/Cu/IZO, Mo/Cu/ITO, or the like.

Figure 5E:
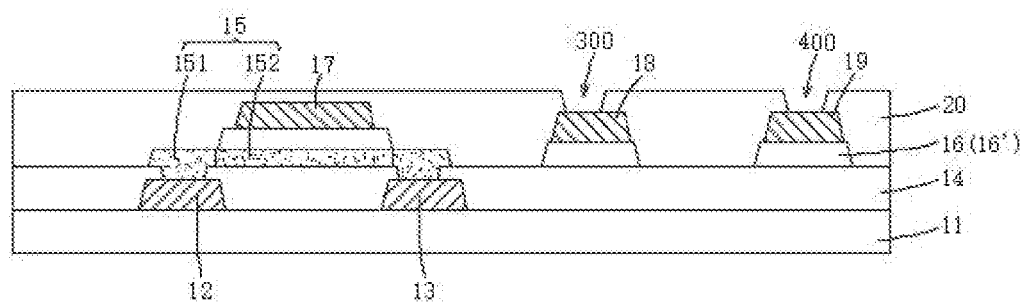
Figure 5F:
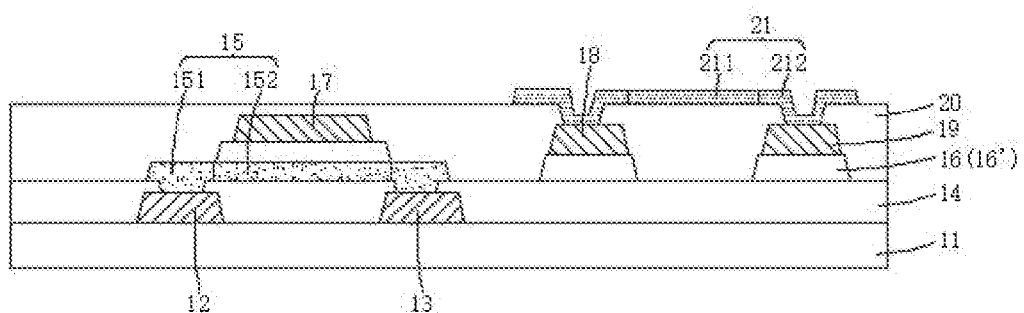
Figure 5G:
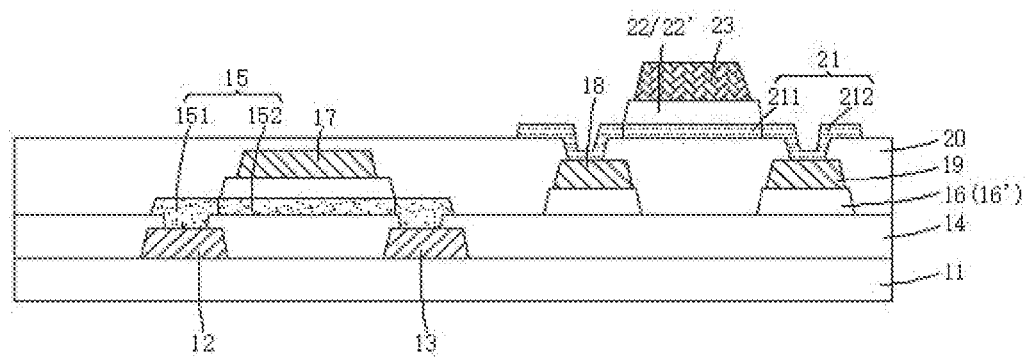

Step S3: as shown in FIGS. 5E-5G, sequentially forming a third insulating layer 20, an oxide semiconductor layer 21, a fourth insulating layer 22, and a second gate electrode 23 on the second metal layer (17, 18, and 19). The third insulating layer 20 is provided with a third via hole 300 exposing the second source electrode 18 and a fourth via hole 400 exposing the second drain electrode 19. The oxide semiconductor layer 21 includes a second channel region 211 and two second conductor regions 212 located on two opposite sides of the second channel region 211. One second conductor region 212 is electrically connected to the second source electrode 18 through the third via hole 300, and the other second conductor region 212 is electrically connected to the second drain electrode 19 through the fourth via hole 400. The second gate electrode 23 corresponds to the second channel region 211.

Specifically, an entire layer of the third insulating layer 20 is formed on the second metal layer (17, 18, and 19), and the third via hole 300 and the fourth via hole 400 penetrating the third insulating layer 20 are formed through a fifth photomask process. An oxide semiconductor film is formed on the third insulating layer 20, and the oxide semiconductor layer 21 is formed by a sixth photomask process. A fourth insulating film and a third metal film are sequentially deposited on the oxide semiconductor layer 21. The fourth insulating film and the third metal film are patterned into a second gate electrode 23 and a fourth insulating pattern 22' stacked on each other through a seventh photomask process. Then, using the second gate electrode 23 and the fourth insulating pattern 22' as a photomask, parts of the oxide semiconductor layer 21 not covered by the fourth insulating pattern 22' are conductorized into the second conductor regions 212.

The first source electrode 12, the first drain electrode 13, the active layer 15, and the first gate electrode 17 constitute a low temperature polysilicon thin film transistor T1. The second source electrode 18, the second drain electrode 19, the oxide semiconductor layer 21, and the second gate electrode 23 constitute an oxide thin film transistor T2.

A material of the second gate electrode 23 is same as a material of the first gate electrode 17. The oxide semiconductor layer 21 is made of a metal oxide material with low leakage current such as IGZO, IGTO, IGZO, IGO, IZO, AIZO, or ATZO.

After Step 2 is completed, the method for fabricating the array substrate further includes the following step.

Figure 5H:
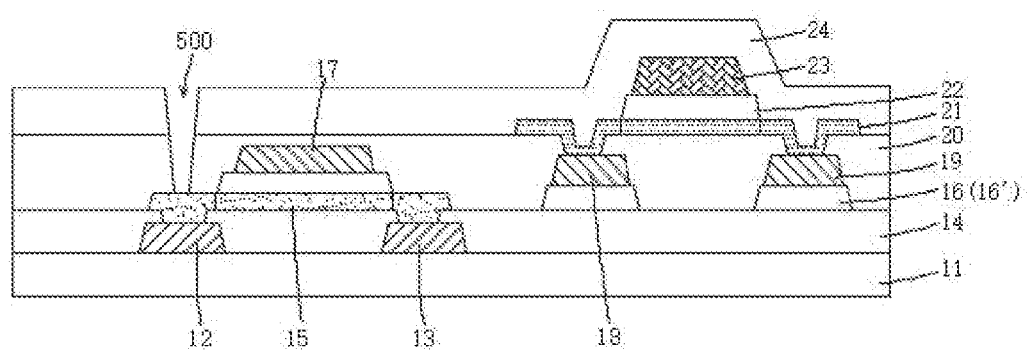
Figure 5I:
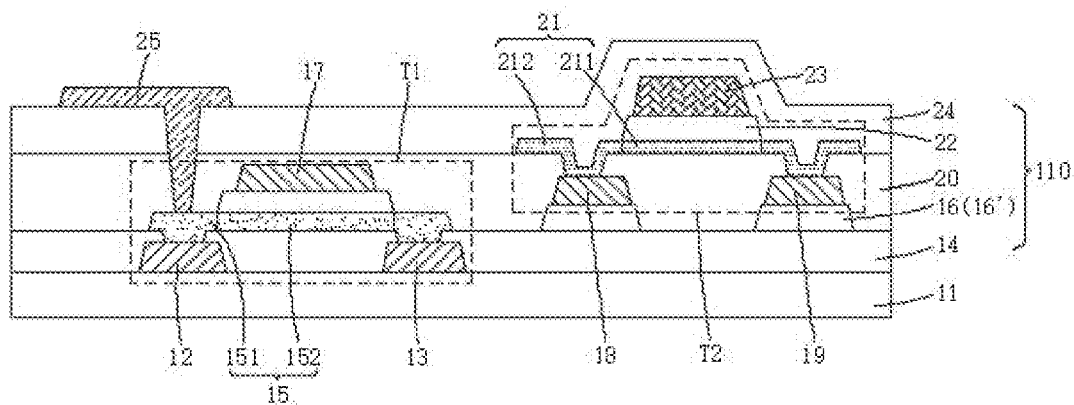

Step 3: as shown in FIGS. 5H and 5I, sequentially forming a fifth insulating layer 24 and a pixel electrode 25 on the second gate electrode 23. The pixel electrode 25 is electrically connected to the low temperature polysilicon thin film transistor T1 through a fifth via hole 500 penetrating the fifth insulating layer 24 and the third insulating layer 20.

The fifth via hole 500 is formed through an eighth photomask process. The pixel electrode 25 is formed by a ninth photomask process.

The first insulating layer 14, the third insulating layer 20, and the fifth insulating layer 24 may be made of SiOx or SiNx, or may be a stacked layer of SiOx/SiNx/SiOx or Al2O3/SiNx/SiOx. The second insulating layer 16 and the fourth insulating layer 22 may be made of SiOx, or may be a stacked layer of SiOx/SiNx.

So far, in this embodiment, the array substrate is fabricated through nine photomask processes.

In this embodiment, the first gate electrode 17 of the low temperature polysilicon thin film transistor T1 and the second source electrode 18 and the second drain electrode 19 of the oxide thin film transistor T2 are formed by using a same photomask, thereby reducing one photomask process and simplifying a manufacturing process. In addition, the low temperature polysilicon thin film transistor T1 and the oxide thin film transistor T2 share the second insulating layer 16 and the third insulating layer 20, which reduces the number of layers of the array substrate and further simplifies the manufacturing process.

In this embodiment, disposing the active layer 15 and the oxide semiconductor layer 21 in different layers has the following advantages. On the one hand, this can prevent doping ions from entering into the oxide semiconductor layer 21 when the active layer 15 is doped with the doping ions. If more doping ions enter the oxide semiconductor layer 21, the oxide semiconductor layer 21 will be conductorized, which reduces electrical stability of the oxide thin film transistor T2. On the other hand, this can avoid an influence on crystalline properties of the oxide semiconductor layer 21 when amorphous silicon of the active layer 15 is converted into polysilicon through a laser annealing process. Therefore, this embodiment can simplify a manufacturing process and maintain the electrical stability of the oxide thin film transistor T2. In addition, in the oxide thin film transistor T2, a bottom surface of the oxide semiconductor layer 21 is in contact with a top surface of the second source electrode 18 and a top surface of the second drain electrode 19, which saves a process of forming an interlayer dielectric layer (ILD) on an oxide semiconductor layer in a conventional structure. The interlayer dielectric layer is generally formed by a CVD process, and a high temperature of the CVD process will affect crystalline properties of the oxide semiconductor layer. The thin film transistors of the present disclosure adopt this structural design, which is beneficial to improve electrical stability of the thin film transistors. Furthermore, in this embodiment, the oxide semiconductor layer 21 is located above the third insulating layer 20 (i.e. the interlayer dielectric layer), so a high temperature of a CVD process of the third insulating layer 20 will not affect the electrical stability of the oxide thin film transistor T2.

Please refer to FIG. 2 and FIG. 3, methods for fabricating the array substrates of the second and third embodiments of the present disclosure are similar to the method for fabricating the array substrate of the first embodiment. For details, please refer to the above description. A difference between the methods is described below. In the array substrates of the second and third embodiments, the orthographic projection of the second source electrode 18 on the substrate 11 overlaps with the orthographic projection of the first drain electrode 13 on the substrate 11. Therefore, after the active layer 15 is formed on the first insulating layer 14 and before the second insulating layer 16 and the second metal layer 17, 18, 19 are formed, the methods for fabricating the array substrates of the second and third embodiments further include: ion doping regions of the active layer 15 to be conductorized to form the first conductor regions 151.

That is, when fabricating the array substrates of the second and third embodiments, the active layer 15 may be conductorized first, and then the second insulating layer 16 and the second metal layer 17, 18, 19 are formed on the active layer 15.

In the above, in an array substrate, a method for fabricating the same, and a display panel provided by the present disclosure, a gate electrode of a low temperature polysilicon thin film transistor and a source electrode and a drain electrode of an oxide thin film transistor are made with a same photomask, so that some layers are shared, and a manufacturing process is simplified. Furthermore, an active layer of the low temperature polysilicon thin film transistor and an oxide semiconductor layer of the oxide thin film transistor are disposed in different layers, thereby simplifying the manufacturing process and maintaining electrical stability of the thin film transistors.

The present invention is described in detail above. The present disclosure uses specific examples to describe principles and implementations of the present invention. The above description of the embodiments is only for helping to understand solutions and core ideas of the present invention. Furthermore, those skilled in the art may make modifications to the specific embodiments and applications according to ideas of the present invention. In conclusion, the present specification should not be construed as a limitation to the present invention.

What is claimed is:

1. An array substrate, comprising:
   at least one low temperature polysilicon thin film transistor comprising an active layer and a first gate electrode; and
   at least one oxide thin film transistor comprising an oxide semiconductor layer, a second source electrode, and a second drain electrode;
   wherein the first gate electrode, the second source electrode, and the second drain electrode are disposed in a same layer, and the active layer and the oxide semiconductor layer are disposed in different layers,
   wherein the array substrate further comprises a substrate, wherein the low temperature polysilicon thin film transistor and the oxide thin film transistor are disposed on the substrate, the first gate electrode is located on a side of the active layer away from the substrate, and the second source electrode and the second drain electrode are located on a side of the oxide semiconductor layer close to the substrate.

2. The array substrate according to claim 1, wherein
   the low temperature polysilicon thin film transistor further comprises a first source electrode and a first drain electrode located on a side of the active layer close to the substrate, the active layer is electrically connected to the first source electrode through a first via hole, and the active layer is electrically connected to the first drain electrode through a second via hole; and
   the oxide thin film transistor further comprises a second gate electrode located on a side of the oxide semiconductor layer away from the substrate, the oxide semiconductor layer is electrically connected to the second source electrode through a third via hole, and the oxide semiconductor layer is electrically connected to the second drain electrode through a fourth via hole.

3. The array substrate according to claim 2, wherein an orthographic projection of the second source electrode on the substrate overlaps with an orthographic projection of the first drain electrode on the substrate, and the orthographic projection of the second source electrode on the substrate is spaced apart from an orthographic projection of the first gate electrode on the substrate.

4. The array substrate according to claim 3, wherein the second source electrode is located between the first gate electrode and the second drain electrode, an orthographic projection of the oxide semiconductor layer on the substrate overlaps with an orthographic projection of the active layer on the substrate, and the orthographic projection of the oxide semiconductor layer on the substrate is spaced apart from an orthographic projection of the first source electrode on the substrate.

5. The array substrate according to claim 4, wherein the oxide semiconductor layer comprises a channel region corresponding to the second gate electrode and two conductor regions located on two opposite sides of the channel region, an orthographic projection of one conductor region on the substrate covers the orthographic projection of the first gate electrode on the substrate, and a capacitor is formed between the conductor region and the first gate electrode.

6. A display panel, comprising an array substrate comprising:
   at least one low temperature polysilicon thin film transistor comprising an active layer and a first gate electrode; and
   at least one oxide thin film transistor comprising an oxide semiconductor layer, a second source electrode, and a second drain electrode;
   wherein the first gate electrode, the second source electrode, and the second drain electrode are disposed in a same layer, and the active layer and the oxide semiconductor layer are disposed in different layers,
   wherein the array substrate further comprises a substrate, wherein the low temperature polysilicon thin film transistor and the oxide thin film transistor are disposed on the substrate, the first gate electrode is located on a side of the active layer away from the substrate, and the second source electrode and the second drain electrode are located on a side of the oxide semiconductor layer close to the substrate.

7. The display panel according to claim 6, wherein
   the low temperature polysilicon thin film transistor further comprises a first source electrode and a first drain electrode located on a side of the active layer close to the substrate, the active layer is electrically connected to the first source electrode through a first via hole, and the active layer is electrically connected to the first drain electrode through a second via hole; and
   the oxide thin film transistor further comprises a second gate electrode located on a side of the oxide semiconductor layer away from the substrate, the oxide semiconductor layer is electrically connected to the second source electrode through a third via hole, and the oxide semiconductor layer is electrically connected to the second drain electrode through a fourth via hole.

8. The display panel according to claim 7, wherein an orthographic projection of the second source electrode on the substrate overlaps with an orthographic projection of the first drain electrode on the substrate, and the orthographic projection of the second source electrode on the substrate is spaced apart from an orthographic projection of the first gate electrode on the substrate.

9. The display panel according to claim 8, wherein the second source electrode is located between the first gate electrode and the second drain electrode, an orthographic projection of the oxide semiconductor layer on the substrate overlaps with an orthographic projection of the active layer on the substrate, and the orthographic projection of the oxide semiconductor layer on the substrate is spaced apart from an orthographic projection of the first source electrode on the substrate.

10. The display panel according to claim 9, wherein the oxide semiconductor layer comprises a channel region corresponding to the second gate electrode and two conductor regions located on two opposite sides of the channel region, an orthographic projection of one conductor region on the substrate covers the orthographic projection of the first gate electrode on the substrate, and a capacitor is formed between the conductor region and the first gate electrode.

11. A method for fabricating an array substrate, comprising:
   providing a base substrate; and
   forming at least one low temperature polysilicon thin film transistor and at least one oxide thin film transistor on the substrate, wherein the low temperature polysilicon thin film transistor comprises an active layer and a first gate electrode, the oxide thin film transistor comprises an oxide semiconductor layer, a second source electrode, and a second drain electrode, the active layer and the oxide semiconductor layer are disposed in different layers, and the first gate electrode, the second source electrode, and the second drain electrode are formed by using a same mask, wherein the forming the at least one low temperature polysilicon thin film transistor and the at least one oxide thin film transistor on the substrate comprises:
   sequentially forming a first metal layer and a first insulating layer on the substrate, wherein the first metal layer comprises a first source electrode and a first drain electrode spaced apart from each other, and the first insulating layer is provided with a first via hole exposing the first source electrode and a second via hole exposing the first drain electrode;
   sequentially forming an active layer, a second insulating layer, and a second metal layer on the first insulating layer, wherein the active layer comprises a first channel region and two first conductor regions located on two opposite sides of the first channel region, one first conductor region is electrically connected to the first source electrode through the first via hole, the other first conductor region is electrically connected to the first drain electrode through the second via hole, the second metal layer comprises a first gate electrode, a second source electrode, and a second drain electrode spaced apart from each other, and the first gate electrode corresponds to the first channel region; and
   sequentially forming a third insulating layer, an oxide semiconductor layer, a fourth insulating layer, and a second gate electrode on the second metal layer, wherein the third insulating layer is provided with a third via hole exposing the second source electrode and a fourth via hole exposing the second drain electrode, the oxide semiconductor layer comprises a second channel region and two second conductor regions located on two opposite sides of the second channel region, one second conductor region is electrically connected to the second source electrode through the third via hole, the other second conductor region is electrically connected to the second drain electrode through the fourth via hole, and the second gate corresponds to the second channel region;
   wherein the first source electrode, the first drain electrode, the active layer, and the first gate electrode constitute a low temperature polysilicon thin film transistor, and the second source electrode, the second drain electrode, the oxide semiconductor layer, and the second gate electrode constitute an oxide thin film transistor.

12. The method for fabricating the array substrate according to claim 11, wherein an orthographic projection of the second source electrode on the substrate overlaps with an orthographic projection of the first drain electrode on the substrate, and after the active layer is formed on the first insulating layer and before the second insulating layer and the second metal layer are formed, the method further comprises:

ion doping regions of the active layer to be conductorized to form the first conductor regions.

* * * * *